(12) United States Patent
Booth, Jr. et al.

(10) Patent No.: US 8,288,240 B2
(45) Date of Patent: Oct. 16, 2012

(54) METHOD OF MAKING AN MIM CAPACITOR AND MIM CAPACITOR STRUCTURE FORMED THEREBY

(75) Inventors: Roger Allen Booth, Jr., Hopewell Junction, NY (US); Kangguo Cheng, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 367 days.

(21) Appl. No.: 12/699,601

(22) Filed: Feb. 3, 2010

(65) Prior Publication Data

US 2010/0207246 A1 Aug. 19, 2010

Related U.S. Application Data

(60) Provisional application No. 61/152,283, filed on Feb. 13, 2009.

(51) Int. Cl.
*H01L 21/02* (2006.01)
(52) U.S. Cl. ........ 438/387; 438/396; 438/957; 257/532; 257/E29.343; 257/E21.015; 257/E21.018

(58) Field of Classification Search .................. 257/532, 257/E29.343, E21.015, E21.018; 438/387, 438/396, 957
See application file for complete search history.

(56) References Cited

U.S. PATENT DOCUMENTS

| 7,115,935 | B2 | 10/2006 | Tu et al. |
|---|---|---|---|
| 2003/0197215 | A1 | 10/2003 | Coolbaugh et al. |
| 2005/0124132 | A1 | 6/2005 | Tu |
| 2006/0148192 | A1 | 7/2006 | Chou et al. |
| 2008/0237792 | A1* | 10/2008 | Kang et al. .................. 257/532 |
| 2009/0090951 | A1* | 4/2009 | Chang et al. .................. 257/306 |

\* cited by examiner

*Primary Examiner* — Tu-Tu Ho
(74) *Attorney, Agent, or Firm* — Joseph P. Abate; Ira D. Blecker

(57) ABSTRACT

A method of forming an MIM capacitor having interdigitated capacitor plates. Metal and dielectric layers are alternately deposited in an opening in a layer of insulator material. After each deposition of the metal layer, the metal layer is removed at an angle from the side to form the capacitor plate. The side from which the metal layer is removed is alternated with every metal layer that is deposited. When all the capacitor plates have been formed, the remaining opening in the layer of insulator material is filled with dielectric material then planarized, followed by the formation of contacts with the capacitor plates. There is also an MIM capacitor structure having interdigitated capacitor plates.

10 Claims, 6 Drawing Sheets

METHOD OF MAKING AN MIM CAPACITOR AND MIM CAPACITOR STRUCTURE FORMED THEREBY

This non-provisional application claims the benefit of the provisional application filed with the U.S. Patent and Trademark Office as Ser. No. 61/152,283 entitled "METHOD OF MAKING AN MIM CAPACITOR AND MIM CAPACITOR STRUCTURE FORMED THEREBY", filed Feb. 13, 2009.

BACKGROUND OF THE INVENTION

The present invention relates to methods of fabricating a metal-insulator-metal (MIM) capacitor, and more particularly, to methods of forming a MIM capacitor having interdigitated capacitor plates.

The fabrication of semiconductor devices would benefit from increasing the capacity density of MIM capacitors because a greater capacity density yields a higher capacitance per unit of chip area. This higher capacitance per unit of chip area would allow MIM capacitors to have a smaller area, which permits greater compacting of semiconductor chips through space savings.

MIM capacitors are capacitors typically built into the back end of the line (BEOL) of a chip, which tend to have very good performance properties compared to front end of the line (FEOL) capacitors. Also, MIM capacitors do not consume space on the silicon, and typically do not consume space in wiring levels. This makes MIM capacitors an attractive option for integrated circuit design. However, they do cost extra processing and extra mask levels.

Conventional MIM capacitors require 1 lithographic level per capacitor plate. Since a capacitor requires a minimum of 2 plates, MIM capacitors will thus require at least 2 plates. Integration schemes to use 3 or more interdigitated capacitor plates can become very complicated and costly.

MIM capacitors have been disclosed generally in Tu et al. U.S. Pat. No. 7,115,935, Tu Patent Application Publication US 2005/0124132 and Chou et al. U.S. Patent Application Publication US 2006/0148192, the disclosures of which are incorporated by reference herein.

Coolbaugh et al. U.S. Patent Application Publication US 2003/0197215, the disclosure of which is incorporated by reference herein, discloses a stacked capacitor arrangement in which the capacitor layers are staggered so that each capacitor layer may be connected to a wiring by a via.

BRIEF SUMMARY OF THE INVENTION

The advantages of the invention have been achieved by providing, according to a first aspect of the invention, a method of making an MIM capacitor, the method comprising the steps of:

forming an opening in an insulator layer on a substrate;
depositing a first metal layer on the insulator layer and in the opening;
removing the first metal layer from the insulator layer and a first wall of the opening;
depositing a dielectric over the insulator and into the opening so as to cover the first metal layer;
depositing a second metal layer;
removing the second metal layer from the dielectric layer and a second wall of the opening, wherein the second wall is different from the first wall;
repeating steps (d), (e) and (f) a predetermined number of times until the desired number of metal layers is formed wherein the removing of the metal layer alternates between the first and second walls;
filling the opening with a dielectric material; and
forming electrical contacts with the metal layers.

According to a second aspect of the invention, there is provided a semiconductor article comprising:
a semiconductor substrate;
an insulator layer on the semiconductor substrate, the insulator having an opening;
an MIM capacitor in the opening comprising a plurality of interdigitated L-shaped capacitor plates separated by a dielectric material.

According to a third aspect of the invention, there is provided an MIM capacitor comprising a plurality of interdigitated L-shaped capacitor plates separated by a dielectric material.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
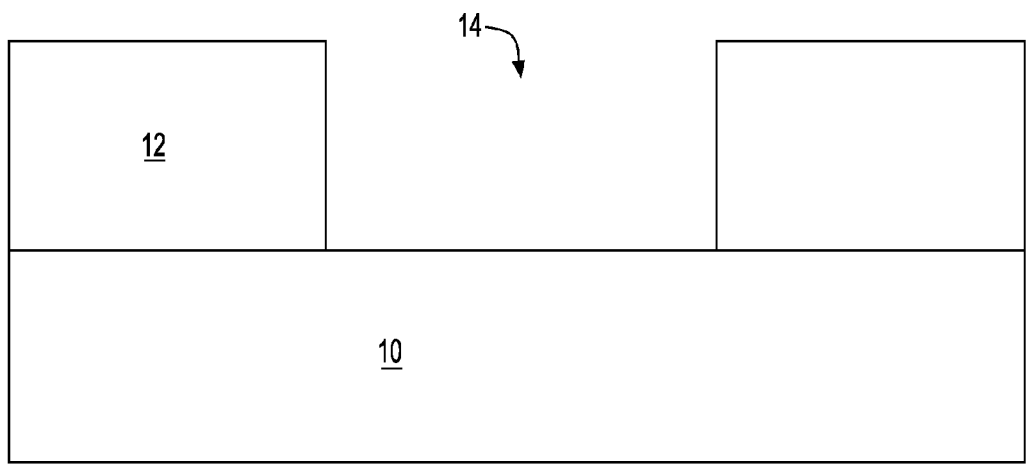
FIGS. 1 to 5 illustrate the steps to form an intermediate structure according to the present invention.

Referring to the Figures in more detail, and particularly referring to FIG. 1, there is shown a semiconductor substrate 10, a layer of insulator material 12 and an opening 14 formed in the insulator material 12. The layer of insulator material 12 can be either shallow trench isolation (STI) dielectric or back end of the line (BEOL) dielectric. If the layer of insulator material 12 is STI dielectric, the semiconductor substrate 10 will be semiconductor material. Alternatively, if the layer of insulator material 12 is BEOL dielectric, the semiconductor substrate 10 will be semiconductor material plus any so-called front end of the line processing that has occurred in or on the semiconductor material and may also include one or more layers of BEOL wiring.

Figure 2:
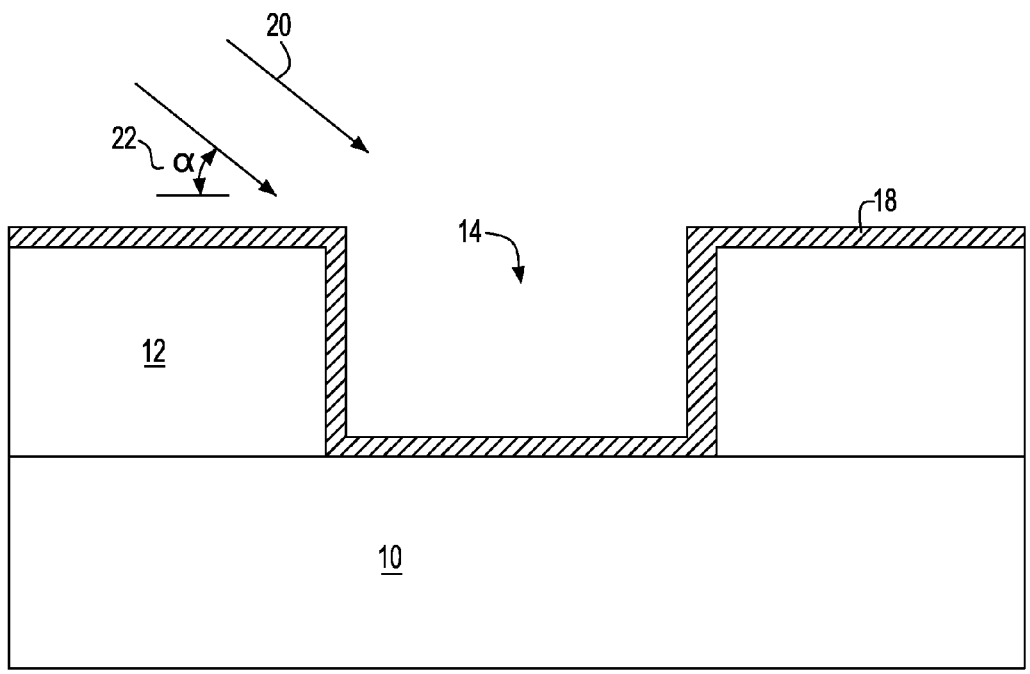

In the next step of the process as shown in FIG. 2, a metal layer 18 is blanket deposited over the layer of insulator material 12 and in the opening 14. The metal layer 18 may be any metallic material that is suitable for capacitors such as copper, aluminum, titanium, tantalum, ruthenium, lead, platinum, tin, silver, gold, tantalum nitride, titanium nitride, tungsten silicide, tungsten nitride, ruthenium oxide, titanium silicide, cobalt silicide, nickel silicide or mixtures thereof. The metal layer 18 should have a thickness of around 100 nanometers (nm), although a lesser or greater thickness is also explicitly contemplated herein. The metal layer 18 can be deposited by a conventional method, including but not limited to, atomic layer deposition (ALD), molecular layer deposition (MLD), chemical vapor deposition (CVD), physical vapor deposition, sputtering, plating, evaporation, ion beam deposition, electron beam deposition, laser assisted deposition, chemical solution deposition, or any combination of those methods.

Figure 3:
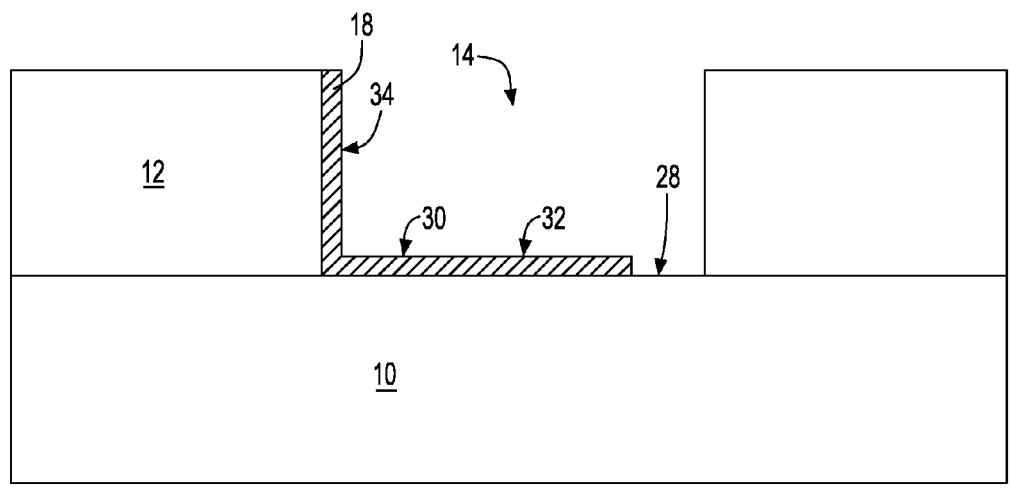

The metal layer 18 is then removed from at least one wall of the opening 14 as shown in FIG. 3. In one preferred embodiment of the present invention, the metal layer 18 is etched, indicated by arrows 20 in FIG. 2, at an angle alpha ($\alpha$) 22 to selectively remove portions of the metal layer 18. One preferred method of etching is sputtering. Sputtering is typically a low-pressure process (a few Torr). For the present invention, the angle of incidence of the sputtering ion is very important. Typical sputtering processes use normal incidence of sputtering ion to target, but this is not required or desired for the present invention. One could use an ion implanter to sputter with the right combination of feedgas and energy, which would allow angles more than 45 degrees from normal. Shown in FIG. 3 is the metal layer 18 after it has been etched to remove portions of the metal layer 18. It is noted that the remaining metal layer 18 will form an L-shaped capacitor plate when the MIM capacitor is completed. The L-shaped capacitor plate, now also indicated by 30, is comprised of a horizontal portion 32 on the bottom of the opening 14 and a vertical portion 34 along the wall of the opening 14. In a preferred embodiment, a segment of horizontal portion 32 is removed, indicated by arrow 28, as a result of the etching process 20.

Figure 4:
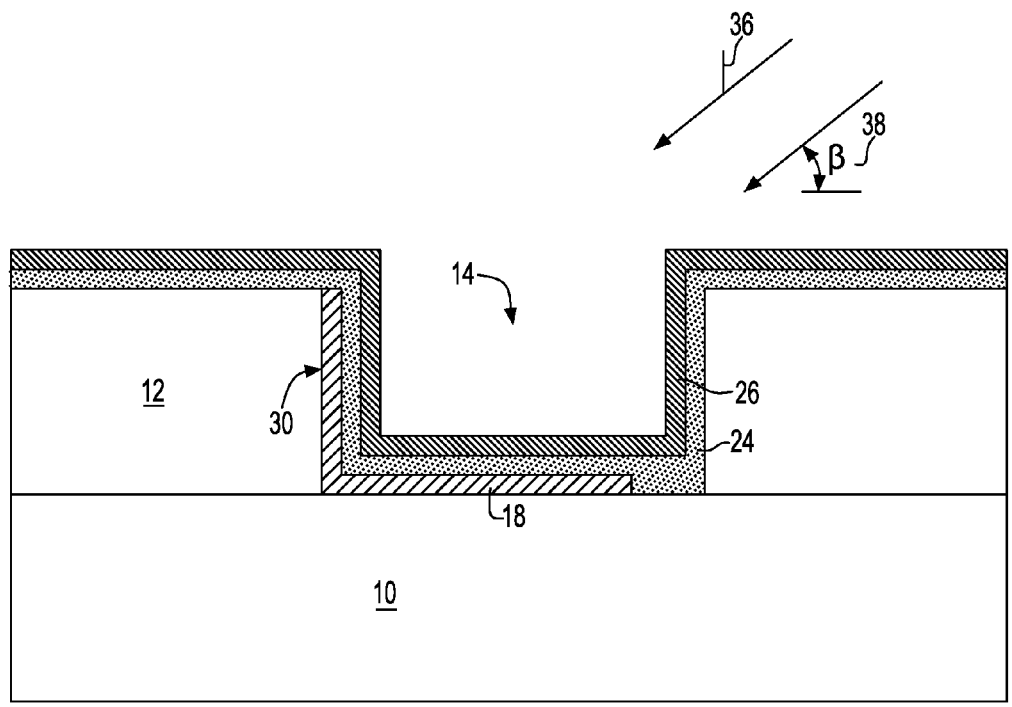

Referring now to FIG. 4, a thin dielectric layer 24 is blanket deposited over the layer of insulator material 12 and L-shaped capacitor plate 30. The dielectric layer 24 has a thickness of around 20 nm. The dielectric layer 24 may be silicon oxide, silicon nitride, silicon oxynitride, and/or any high dielectric constant (i.e., high K) material. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate, and any combination of these materials. The dielectric layer 24 can be deposited by a conventional method such as ALD and/or CVD. Thereafter, another metal layer 26 is deposited over the dielectric layer 24. Metal layer 26 is of the same approximate thickness and material as metal layer 18. The metal layer 26 is then removed, preferably by etching, indicated by arrows 36, at an angle ($\beta$) 38 to selectively remove portions of the metal layer 26. One preferred method of etching is sputtering. The etching 36 of metal layer 26 is from the opposite direction that metal layer 18 was etched. That is, comparing FIGS. 2 and 4, it can be seen that metal layer 18 was etched 20 at an angle $\alpha$ 22 from the left while metal layer 26 is etched 36 at an angle $\beta$ 38 from the right. Angle $\alpha$ 22 will usually be the same as angle $\beta$ 38. It is desirable to alternate the directions of etching so as to form the capacitor plates necessary to the formation of the MIM capacitor according to the present invention.

The etching angle for angle $\alpha$ 22 and angle $\beta$ 38 depends on the geometry of the trench, particularly the aspect ratio of the trench. The aspect ratio is defined as the ratio between the depth and width of the trench. As an example, an etching angle of about 45 degrees will work for a trench with an aspect ratio of 1, meaning the trench has equal depth and width. For most applications, the preferred etching angle will be in the range of 30-60 degrees, although it should be understood that the etching angle can range as high as 80 degrees or as low as 10 degrees for some applications.

Figure 5:
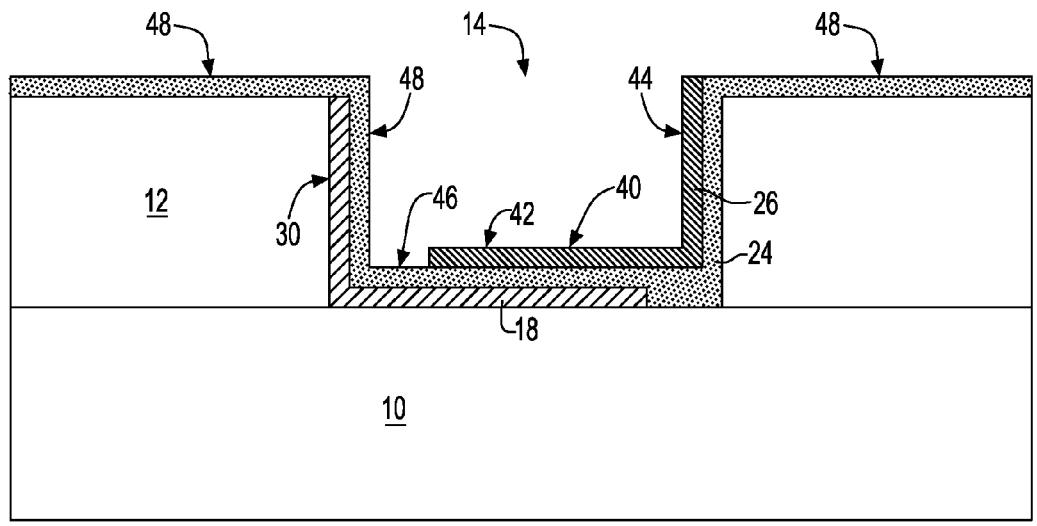

Shown in FIG. 5 is the metal layer 26 after it has been etched to remove portions of the metal layer 26. It is noted that the remaining metal layer 26 will form an L-shaped capacitor plate when the MIM capacitor is completed. The L-shaped capacitor plate, now also indicated by 40, is comprised of a horizontal portion 42 approximately parallel to the bottom of the opening 14 and a vertical portion 44 approximately parallel to the wall of the opening 14. In a preferred embodiment, a segment of horizontal portion 42 is removed, indicated by arrow 46, as a result of the etching process 36.

Figure 5A:
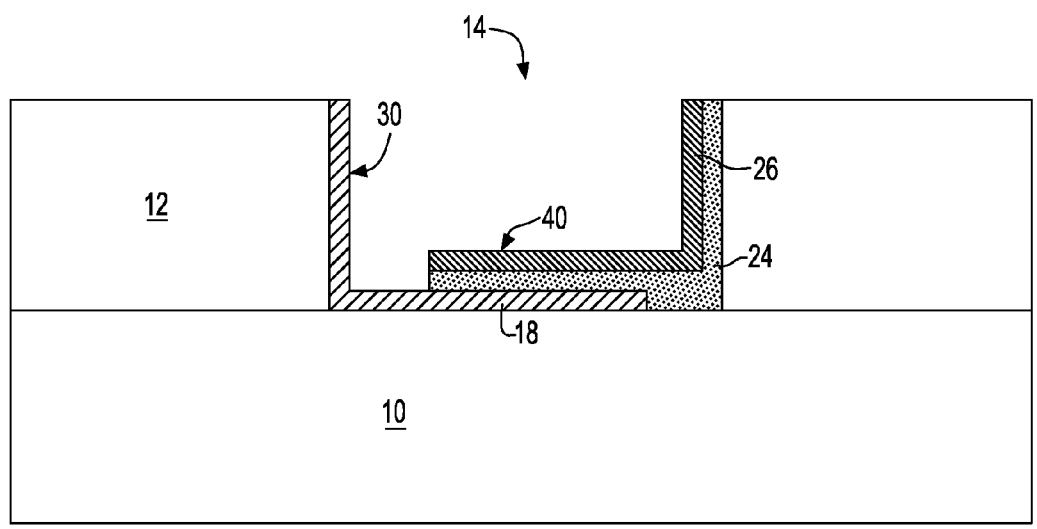
FIG. 5A illustrates an optional step in forming an MIM capacitor according to the present invention.

An optional step then may be performed to remove any exposed dielectric that may have been damaged by the etching of the metal layer 26. The exposed dielectric, indicated by arrows 48 in FIG. 5, may be removed by a wet etch process but a dry process such as reactive ion etching could also be utilized. Referring now to FIG. 5A, the exposed and possibly damaged dielectric has been removed. Note that there is no dielectric on the layer of insulator material 12 or on the exposed surfaces of the capacitor plates 30, 40.

In the following sequence of steps, additional metal and dielectric layers will be deposited and selectively removed as has been described already to build up the various layers of the MIM capacitor according to the present invention. In the remaining FIGS. 6 through 9, the exposed dielectric has not been removed although removal of the subsequent layers of exposed dielectric could certainly be removed as taught with reference to FIG. 5A.

Figure 6:
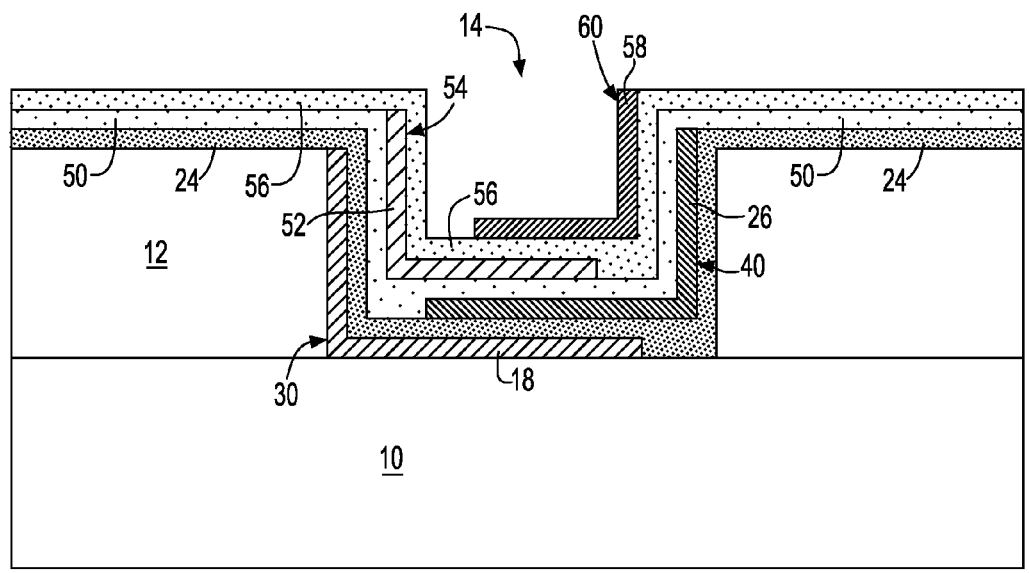
FIGS. 6 to 9 illustrate the steps to go from the intermediate structure in FIG. 5 to a first preferred embodiment of the present invention.

The process continues in FIGS. 6 through 9 to form additional capacitor plates in opening 14. Referring to FIG. 6 (and continuing from FIG. 5), dielectric layer 50 is deposited over dielectric layer 24 and capacitor plate 40. Another metal layer 52 is deposited over dielectric layer 50 and then etched from the left at an angle $\alpha$ (etching not shown for clarity) to result in capacitor plate 54. Dielectric layer 56 is then deposited. The next metal layer 58 is deposited over dielectric layer 56 and then etched from the right at an angle $\beta$ (etching not shown for clarity) to result in capacitor plate 60.

As noted previously, the direction of dry etching alternates with each capacitor plate so that capacitor plates 54 and 60 are dry etched from different (usually opposite) directions.

Shown in FIG. 6 is a partial MIM capacitor structure in which there are four interdigitated plates. Additional capacitor plates can be formed in a like manner if desired.

Figure 7:
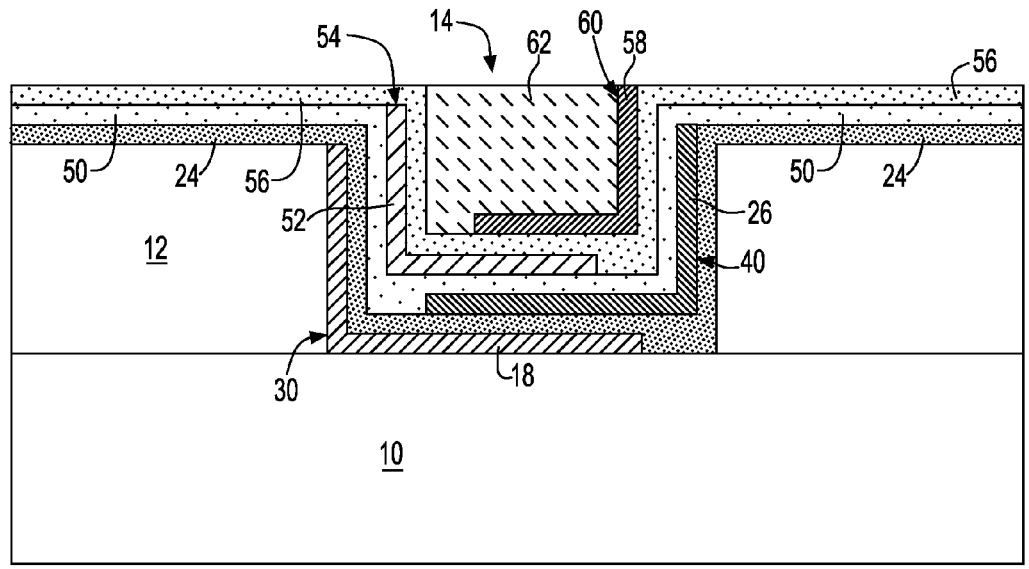

Referring now to FIG. 7, additional dielectric material 62, such as an oxide or nitride for example, has been added into opening 14 and then planarized by a conventional process such as chemical-mechanical polishing.

Figure 8:
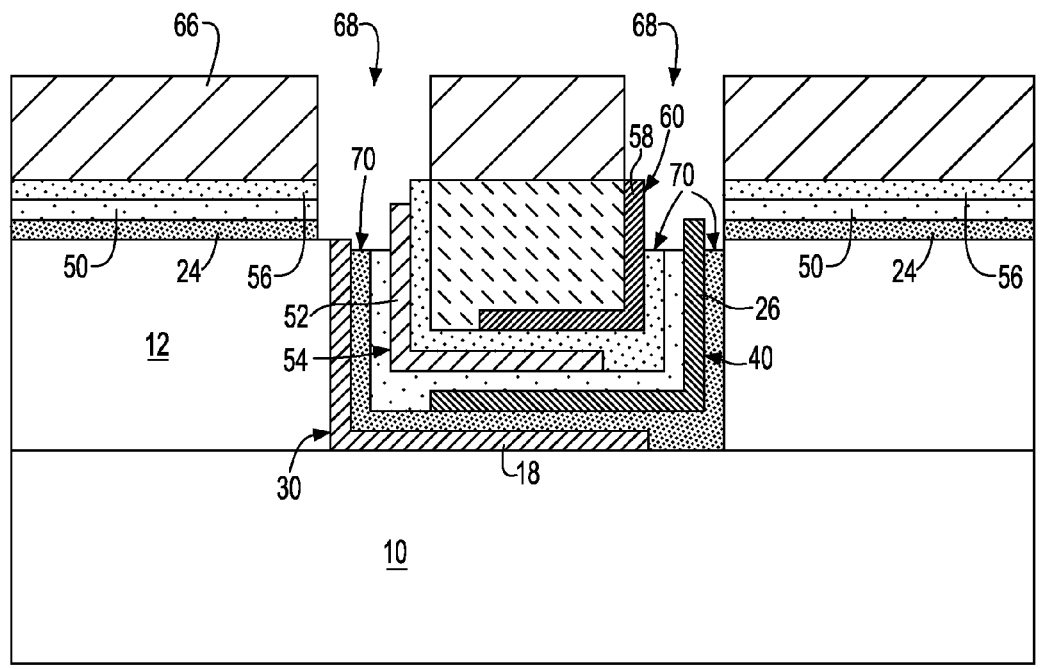

Referring now to FIG. 8, the process will be described for forming contacts with the capacitor plates 30, 40, 54, 60. A suitable mask material 66 is deposited and then patterned (for example, by reactive ion etching) to form openings 68. The mask material could be a hard mask such as a nitride. The openings could be formed by a layer of photoresist on top of the hard mask, then exposed and developed to form openings which are then driven into the hard mask. Alternatively, the mask material 66 could be a soft mask such as a photoresist which is exposed and developed to form the openings 68. If the layer of insulator material 12 is the STI dielectric, the forming of the openings 68 can be integrated with the contact array (CA) process in standard CMOS processing so that no extra mask and process are needed to form the contacts. If the layer of insulator material 12 is formed in the BEOL dielectric, one extra mask will be needed to form the openings 68.

Still referring to FIG. 8, once the openings 68 have been formed, the dielectric layers 24, 50 are recessed by a conventional process as indicated by arrows 70 to expose the ends of the capacitor plates 30, 40, 54, 60.

Figure 9:
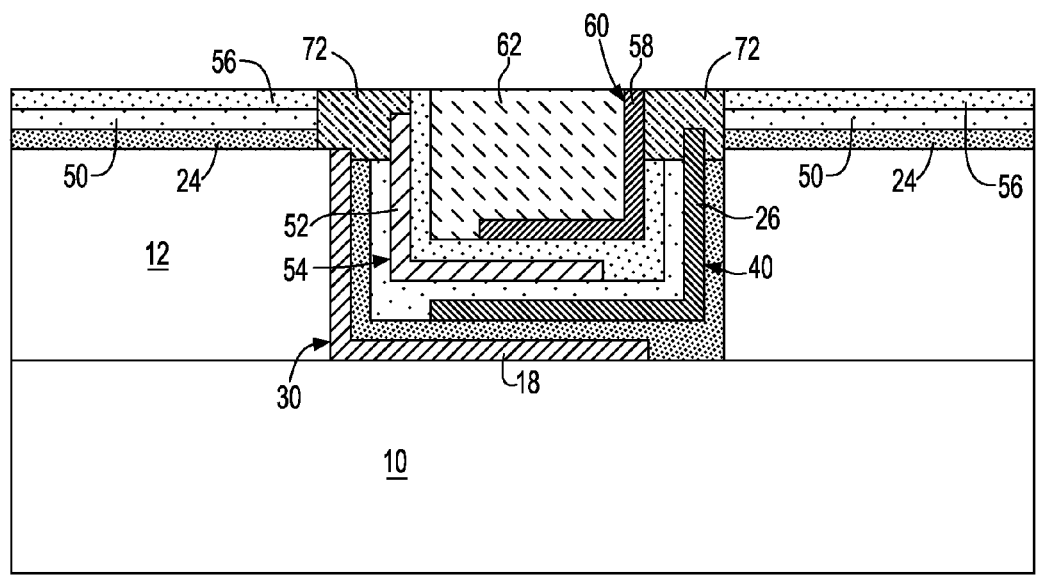

One preferred embodiment of the final capacitor structure according to the present invention is shown in FIG. 9. In one preferred processing sequence, the mask material 66 (shown in FIG. 8) is removed and then the contact material 72 has been deposited. One preferred method of depositing the contact material 72 is by blanket depositing the contact material 72 and then planarizing by a process such as chemical-mechanical polishing.

Figure 9A:
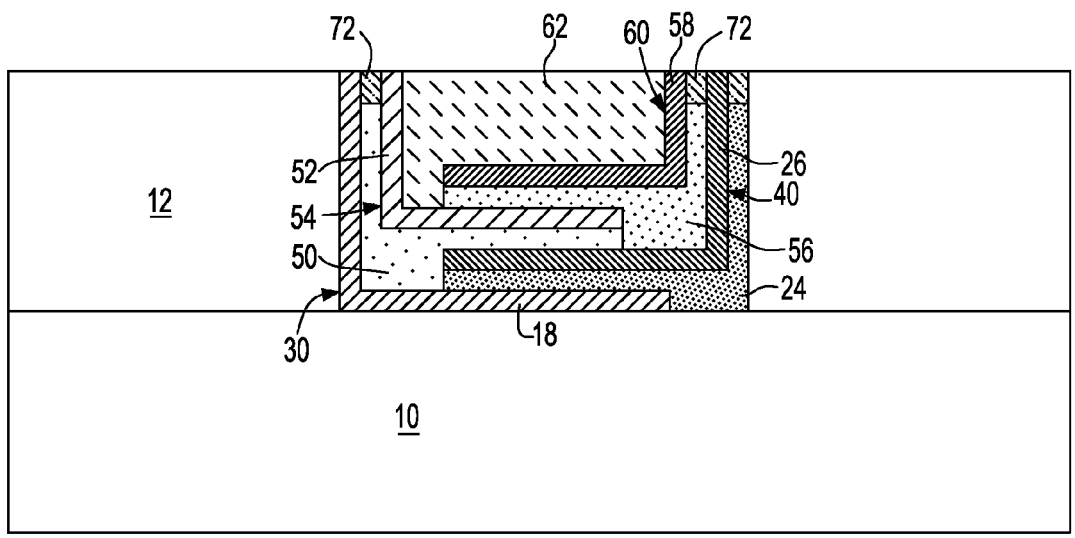
FIG. 9A illustrates a second preferred embodiment of the present invention in which the optional step illustrated in FIG. 5A is utilized.

Another preferred embodiment of the final capacitor structure according to the present invention is shown in FIG. 9A. The capacitor structure shown in FIG. 9A is essentially identical to the capacitor structure shown in FIG. 9 except that in the preferred embodiment of FIG. 9A, the exposed and possibly damaged dielectric material has been removed, as taught with respect to FIG. 5A, in each of the subsequent processing steps.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

The invention claimed is:

1. A method of making an MIM capacitor, the method comprising the steps of:
    (a) forming an opening in an insulator layer on a substrate;
    (b) depositing a first metal layer on the insulator layer and in the opening;
    (c) removing the first metal layer from the insulator layer and a first wall of the opening;
    (d) depositing a dielectric over the insulator and into the opening so as to cover the first metal layer;
    (e) depositing a second metal layer;
    (f) removing the second metal layer from the dielectric layer and a second wall of the opening, wherein the second wall is different from the first wall;
    (g) repeating steps (d), (e) and (f) a predetermined number of times until the desired number of metal layers is formed wherein the removing of the metal layer alternates between the first and second walls;
    (h) filling the opening with a dielectric material; and
    (i) forming electrical contacts with the metal layers.

2. The method of claim 1 wherein the insulator layer is a shallow trench isolation layer.

3. The method of claim 1 wherein the insulator layer is a back end of the line layer.

4. The method of claim 1 wherein the first and second metal layers are selected from the group consisting of copper, aluminum, titanium, tantalum, ruthenium lead, platinum, tin, silver, gold, tantalum nitride, titanium nitride, tungsten silicide, tungsten nitride, ruthenium oxide, titanium silicide, cobalt silicide, nickel silicide and mixtures thereof.

5. The method of claim 1 wherein in step (c) removing the first metal layer from a first wall is by etching at an angle from a first direction, wherein in step (f) removing the second metal layer from a first wall is by etching at an angle from a second direction, wherein the second direction is different from the first direction and wherein in step (g) the angle of etching alternates between the first and second directions with the etching of each metal layer.

6. The method of claim 5 wherein the etching step is by sputtering.

7. The method of claim 1 wherein the angle of etching is about 30 to 60 degrees from the horizontal.

8. The method of claim 1 wherein in steps (c) and (f), the step of removing partially removes the metal layer from a bottom of the opening.

9. The method of claim 1 wherein between steps (f) and (g), further including the step of removing a layer of exposed dielectric after the step of removing and step (g) includes the step of removing a layer of exposed dielectric each time step (f) is repeated.

10. The method of claim 1 wherein the dielectric material in steps (d) and (h) is a high dielectric constant material.

* * * * *